(12) United States Patent
Yi et al.

(10) Patent No.: US 11,068,683 B2
(45) Date of Patent: Jul. 20, 2021

(54) DISPLAY DEVICE AND METHOD FOR ATTACHING FINGERPRINT MODULE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lixiang Yi, Beijing (CN); Feng Xiao, Beijing (CN); Haoqing Guo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/640,616

(22) PCT Filed: Sep. 9, 2019

(86) PCT No.: PCT/CN2019/104879
§ 371 (c)(1),
(2) Date: Feb. 20, 2020

(87) PCT Pub. No.: WO2020/093776
PCT Pub. Date: May 14, 2020

(65) Prior Publication Data
US 2021/0027039 A1    Jan. 28, 2021

(30) Foreign Application Priority Data

Nov. 5, 2018 (CN) .......................... 201811306710.1

(51) Int. Cl.
*G09G 3/20* (2006.01)
*G06K 9/00* (2006.01)
(Continued)

(52) U.S. Cl.
CPC ....... *G06K 9/00013* (2013.01); *G06F 3/0416* (2013.01); *G09G 3/20* (2013.01); *G06F 3/0412* (2013.01); *H05K 1/028* (2013.01)

(58) Field of Classification Search
CPC . G06F 9/00013; G06F 3/0412; G06F 3/0416; G06F 3/04164; G09G 3/20; H05K 1/028
See application file for complete search history.

(56) References Cited

U.S. PATENT DOCUMENTS

2016/0224818 A1    8/2016  Song et al.
2017/0372114 A1   12/2017  Cho et al.
2019/0274222 A1*   9/2019  Kim .................... H04M 1/0277

FOREIGN PATENT DOCUMENTS

CN    202261488 U    5/2012
CN    103927468 A    7/2014
(Continued)

*Primary Examiner* — Robert J Michaud
(74) *Attorney, Agent, or Firm* — The Webb Law Firm

(57) ABSTRACT

The embodiments of the present disclosure disclose a display device and a method for attaching a fingerprint module. The display device comprises: a display panel, a fingerprint module and a functional flexible circuit board (FPC); a glue film is attached to a side of the display panel away from a light emitting surface, and an opening area is provided in the glue film, the functional FPC is attached to the side of the display panel away from the light emitting surface with the glue film; the fingerprint module is disposed on a side of the functional FPC close to the display panel, and the fingerprint module is embedded in the opening area of the glue film.

18 Claims, 7 Drawing Sheets

(51) Int. Cl.
*G06F 3/041* (2006.01)
*H05K 1/02* (2006.01)

(56) References Cited

FOREIGN PATENT DOCUMENTS

| | | |
|---|---|---|
| CN | 205620974 U | 10/2016 |
| CN | 106407967 A | 2/2017 |
| CN | 206209652 U | 5/2017 |
| CN | 206236113 U | 6/2017 |
| CN | 107092889 A | 8/2017 |
| CN | 107390780 A | 11/2017 |
| CN | 107545234 A | 1/2018 |
| CN | 109460731 A | 3/2019 |

* cited by examiner

DISPLAY DEVICE AND METHOD FOR ATTACHING FINGERPRINT MODULE

CROSS-REFERENCE TO RELATED APPLICATIONS

This application is a U.S. National Stage under 35 U.S.C. § 371 of International Application No. PCT/CN2019/104879, as filed on Sep. 9, 2019, which claims priority to Chinese Patent Application No. 201811306710.1, as filed on Nov. 5, 2018 and entitled "DISPLAY DEVICE AND METHOD FOR ATTACHING FINGERPRINT MODULE". The disclosure of each of these applications is hereby incorporated by reference in its entirety.

TECHNICAL FIELD

The present application relates to a display device and a method for attaching a fingerprint module.

BACKGROUND

As a commonly used means of identity identification, fingerprint recognition technology has now become standard for mobile terminals such as mobile phones. With the development of full-screen technology, a fingerprint recognition module of a display device such as a mobile phone is gradually transferred to the back of the display screen to simultaneously realize under-screen fingerprint recognition and full-screen display.

SUMMARY

The. According to some embodiments of the disclosure, there is provided a display device comprising: a display panel, a fingerprint module and a functional flexible circuit board (FPC); a glue film is attached to a side of the display panel away from a light emitting surface, and an opening area is provided in the glue film, the functional FPC is attached to the side of the display panel away from the light emitting surface with the glue film; the fingerprint module is disposed on a side of the functional FPC close to the display panel, and the fingerprint module is embedded in the opening area of the glue film.

In some embodiments, the functional FPC provided with the fingerprint module comprises at least one of: a flexible circuit board MFPC for driving display, a flexible circuit board TFPC for driving touch, or a flexible circuit board M-T FPC for driving display and touch.

In some embodiments, the fingerprint module is located in a closed space formed by the opening area of the glue film, the display panel and the functional FPC.

In some embodiments, there is a gap between the fingerprint module and the display panel.

In some embodiments, the fingerprint module is coupled to a main board of the display device via a connector of the functional FPC.

In some embodiments, the functional FPC includes the MFPC, the fingerprint module is disposed on a side of the MFPC close to the display panel, and is coupled to a main board of the display device via a connector of the MFPC.

In some embodiments, the display device further comprises the TFPC partially overlapping the MFPC, wherein the TFPC is coupled to the main board of the display device via a connector of the TFPC, and the connector of the TFPC is disposed on an area where the TFPC partially overlaps the MFPC.

In some embodiments, the functional FPC comprises the TFPC, the fingerprint module is disposed on a side of the TFPC close to the display panel and is coupled to a main board of the display device via a connector of the TFPC.

In some embodiments, the display device further comprises the MFPC that partially overlaps the TFPC, wherein the TFPC includes a first part and a second part, wherein the fingerprint module is disposed on the first part and the first part does not overlap with the MFPC, wherein a second part partially overlaps the MFPC and a connector coupled to the main board of the display device is provided on the overlapped portion.

In some embodiments, the functional FPC comprises the TFPC, the display device further comprises the MFPC that partially overlaps the TFPC, the fingerprint module is provided on a side of the TFPC close to the display panel and is connected to the MFPC via a connector of the TFPC, so as to be coupled to a main board of the display device via a connector of the MFPC.

In some embodiments, the TFPC comprises a first part and a second part, wherein the fingerprint module is provided on the first part and the first part does not overlap the MFPC, and the second part partially overlaps the MFPC and the connector is provided on the overlapped portion.

In some embodiments, the functional FPC includes the M-T FPC, the fingerprint module is disposed on a side of the M-T FPC close to the display panel and is coupled to a main board of the display device via a connector of the M-T FPC.

In some embodiments, the glue film comprises a heat dissipation layer and a glue layer laminated, wherein the heat dissipation layer is disposed on a side of the display panel away from the light emitting surface, one side of the glue film is attached to the heat dissipation layer, and the other side of the glue film is attached to the functional FPC.

In some embodiments, the glue film covers completely a side of the display panel away from the light emitting surface.

In some embodiments, the display device further comprises a Chip On FPC, wherein the Chip On FPC is connected with a flexible circuit board MFPC for driving display or a flexible circuit board M-T FPC for driving display and touch via a connector of the Chip On FPC, so as to be coupled with a main board of the display device through the MFPC or the M-T FPC.

In some embodiments, the Chip On FPC is connected to the MFPC or M-T FPC at a lower end of the MFPC or M-T FPC via a connector provided at an upper end of the Chip On FPC.

In some embodiments, the display device further comprises a glass cover provided on a side of the display panel close to the light emitting surface.

According to other embodiments of the disclosure, there is provided a method for attaching a fingerprint module, comprising: installing the fingerprint module on a functional flexible circuit board (FPC); and attaching the functional FPC with the fingerprint module to a side of a display panel away from a light emitting surface with a glue film, so that the fingerprint module is located in an opening area of the glue film.

In some embodiments, the functional FPC is one of the following: a MFPC for driving display, a TFPC for driving touch, and a M-T FPC for driving display and touch.

In some embodiments, attaching the functional FPC with the fingerprint module to the side of a display panel away from the light emitting surface with a glue film, comprising: aligning the fingerprint module in the functional FPC with the opening area of the glue film; and bending the functional FPC, and attaching the functional FPC and the fingerprint module to the side of the display panel away from the light emitting surface through a bonding process, so that the fingerprint module is located in the opening area of the glue film.

BRIEF DESCRIPTION OF THE DRAWINGS

The drawings are used to provide a further understanding of the technical solutions of the present disclosure, and constitute a part of the description. They are used to explain the technical solutions of the present disclosure together with the embodiments of the present application, and do not constitute a limitation to the technical solutions of the present disclosure.

DETAILED DESCRIPTION

Figure 1:
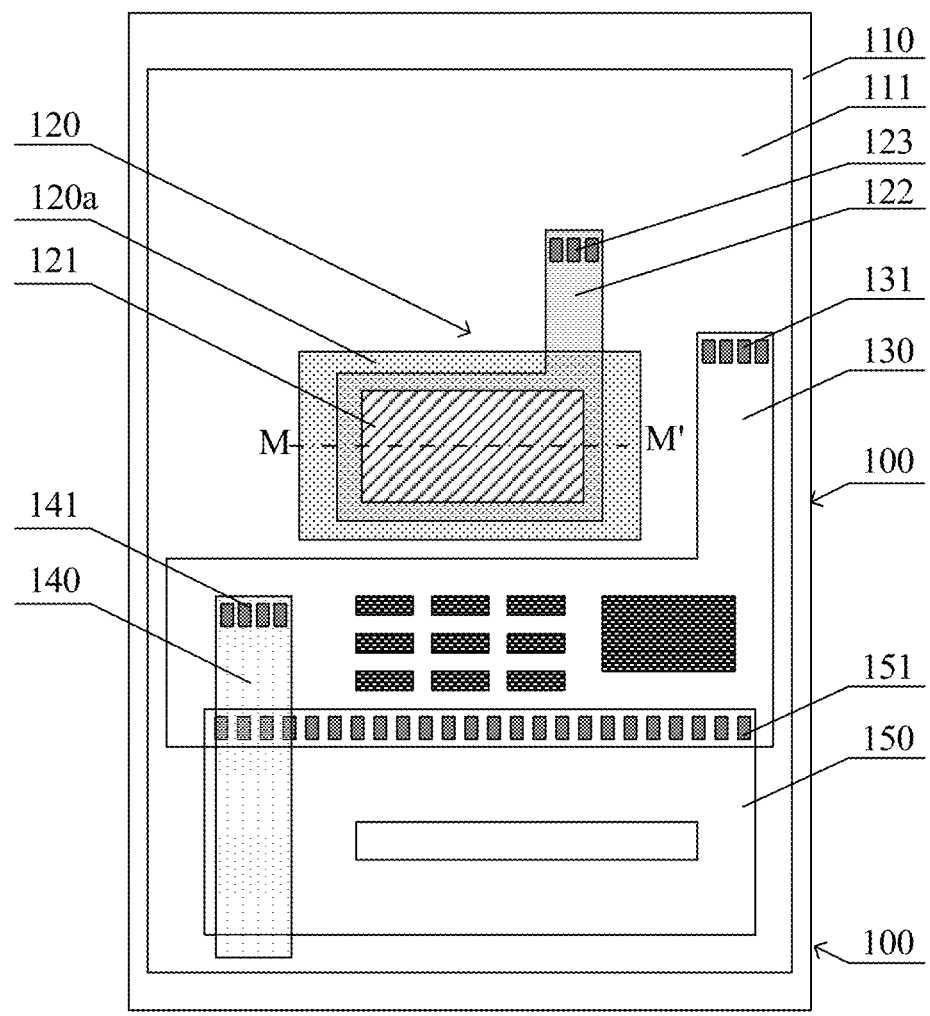
FIG. 1 is a schematic diagram of the overall structure of a display device in the related technology.

In order to make the objectives, technical solutions, and advantages of the present disclosure more clear, the embodiments of the present disclosure will be described in detail below with reference to the accompanying drawings. It should be noted that, in the case of no conflict, the embodiments in the present application and the features in the embodiments can be arbitrarily combined with each other.

The present disclosure provides the following specific embodiments that can be combined with each other. The same or similar concepts or processes may not be described in detail in some embodiments.

The methods of integrating and attaching a fingerprint identification module in a display screen in the related technology are generally as follows: firstly, forming a separate fingerprint module by making chips, sensors, connectors and its accessories of the fingerprint module into a dedicated flexible printed circuit (FPC), then bonding the fingerprint module to the back of the display screen, and finally connecting, via a connector of the dedicated FPC, the fingerprint module to devices such as the FPC or a main board of a mobile phone for achieving specific functions in the display device. Obviously, to make a separate fingerprint module, additional dedicated FPC carrier(s), connector(s) and other components are required; dedicated machines are required to perform additional device mounting process so that the fingerprint module can be attached to the back of the display screen by the dedicated machines through main processes such as identifying, grabbing, attaching and sealing.

In summary, the integration method and attaching process of the related fingerprint module not only add additional dedicated FPCs, connectors and other components and their mounting processes, but also increase the attaching process steps of the fingerprint module and investment in the dedicated machines. The cost of a display device such as a mobile phone is increased.

The embodiments of the present disclosure provide a display device and a method for attaching a fingerprint module to solve a problem of higher cost in the related display device, since the integration and attaching method of a fingerprint module in the related display device requires an additional dedicated FPC carrier and requires dedicated machines to implement additional device mounting processes.

There is provided a display device and a method for attaching a fingerprint module according to an embodiment of the present disclosure, wherein the display device includes a display panel, a fingerprint module, and a functional FPC; and a glue film is attached to a side of the display panel away from a light emitting surface; the glue film has an opening area, and the functional FPC is attached to the side of the display panel away from the light emitting surface with the glue film; the fingerprint module is disposed on a side of the functional FPC close to the display panel, and the fingerprint module is embedded in the opening area of the glue film with the functional FPC to realize the integration and bonding of the fingerprint module and the display panel. The display device provided by the present disclosure adopts the attaching process of the functional device, i.e., the functional FPC, in the display device can attach the fingerprint module to the side of the display panel away from the light emitting surface. Making of a separate fingerprint module is not required. Dedicated FPC carrier, connector and packaging components of the related fingerprint module are saved, meanwhile, special machines and corresponding attaching processes used when the related fingerprint module is attached are saved. Hence, manufacturing cost of the display device is greatly reduced.

Figure 2:
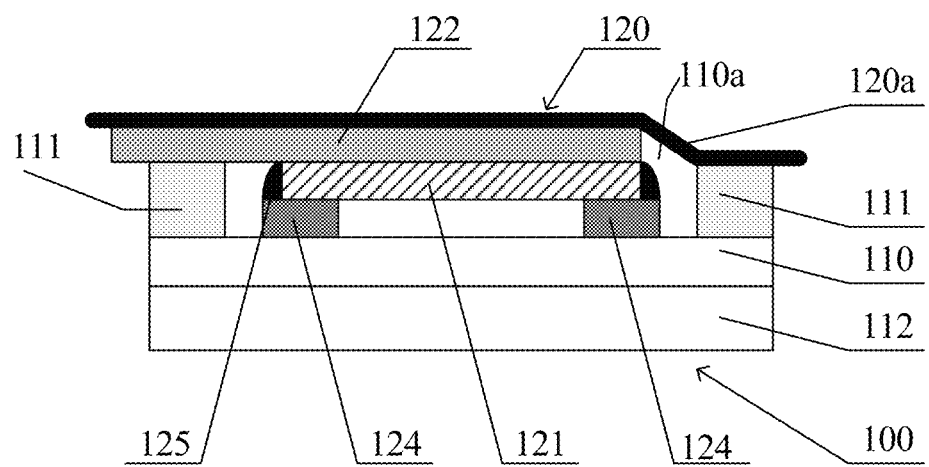
FIG. 2 is a schematic partial structural diagram of the display device shown in FIG. 1.

FIG. 1 is a schematic diagram of the overall structure of a display device in the related technology, and FIG. 2 is a schematic partial structural diagram of the display device shown in FIG. 1, which is, for example, a cross-sectional view taken along a line M-M' in FIG. 1. FIG. 1 shows a display device 100 with a display panel 110, a fingerprint module 120, a MFPC 130 and its connector 131, a TFPC 140 and its connector 141, a Chip On FPC 150 and its connector 151, etc. Also shown is a glue film 111 for attaching the display panel 110 and the above-mentioned devices (the glue film 111 is, for example, a heat dissipation film (Super Clean Foam, SCF for short) with adhesive effect, and the glue film may include a heat dissipation layer and a glue layer) and a light shielding tape 120a for packaging the fingerprint module, wherein the fingerprint module 120 includes a sensor for realizing fingerprint recognition (Finger Print Sensor, FPS for short) 121, a dedicated FPC 122, and its connector 123 and other components. FIG. 2 is a cross-sectional view of a portion of the fingerprint module 120 in the display device 100. FIG. 2 shows the display panel 110, the glue film 111, and a glass cover 112, and the specific structure of the fingerprint module 120, wherein the fingerprint module 120 shows the FPS 121, the dedicated FPC 122, a frame glue 124 between the FPS 121 and the display panel 110, and side walls 125 on both sides of the FPS 121. It also shows the light shielding tape 120a used to encapsulate the fingerprint module 120. The above-mentioned frame glue may be a polymer coagulant, such as Polymeric Aluminum Sulfate (abbreviated as: PAS), and may also be other materials. During the manufacturing process of the above display panel 110, it is required to assemble the FPS 121, the dedicated FPC 122, the connector 123, and the frame glue 124 and other necessary components to realize a separate fingerprint module 120, that is, the fingerprint module 120 in FIGS. 1 and 2 needs to be manufactured separately. The fingerprint module 120 is attached to the back of the display panel 110 by special machines though main processes such as identifying, grasping, attaching and sealing. The main attaching process flow is: attaching the fingerprint module to the frame glue→attaching the fingerprint module with the frame glue to the back of the display screen→sealing around the fingerprint module and curing→attaching the light shielding tape.

In the above related display device, the integration and attaching method of the fingerprint module and the display panel has the following issues:

First, separately production of the fingerprint module needs to provide additional dedicated FPCs, connectors, and packaging components, the packaging components may include components such as the above-mentioned frame glue and light shielding tape;

Second, a special process machine is required for additional attaching processes. The process of the attaching processes mainly includes: identification, grasping, attaching, sealing and curing, and attaching a light shielding glue tape;

Third, attaching the fingerprint module and the display panel will cause a certain degree of bad loss to the back of the display panel; when attaching the fingerprint module, it is necessary to directly attach the display panel with a frame glue, which will cause damage to the display panel;

Fourth, the window formed in the glue film for attaching the display panel and other components is larger than the fingerprint module, which leads to a light leakage (shadow mura) phenomenon. In the related technology, because there is light leakage, the light shielding tape 120a shown in FIG. 2 is added. Although the problem of light leakage can be solved, the light shielding tape 120a increases thickness, and adds a process flow.

In addition, based on the manufacturing method of the integrated fingerprint module in the related display device, the manufacturing cost of the display device will be increased.

Figure 3:
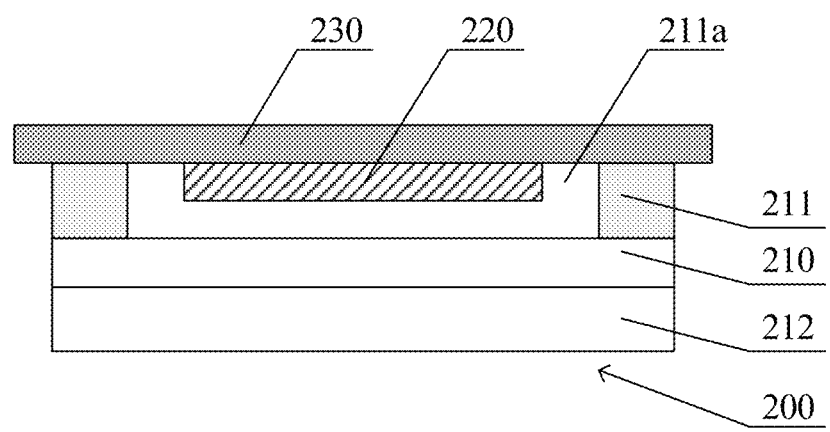
FIG. 3 is a schematic structural diagram of a display device according to an embodiment of the present disclosure.

FIG. 3 is a schematic structural diagram of a display device according to an embodiment of the present disclosure. The display device 200 provided in this embodiment may include a display panel 210, a fingerprint module 220, and a functional FPC 230.

A glue film 211 is attached to a side of the display panel 210 away from the light emitting surface, and an opening area 211a is provided in the glue film 211. The functional FPC 230 is attached with the glue film 211 to a side of the display panel 210 away from the light emitting surface.

The fingerprint module 220 is disposed on a side of the functional FPC 230 close to the display panel, and the fingerprint module 220 is embedded in the opening area 211a of the glue film 211 with the functional FPC 230.

FIG. 3 illustrates a cross-sectional view of the display device 200, and FIG. 3 illustrates only a part of the structure of the display device 200, in particular, a cross-sectional view of a position where the fingerprint module 220 is located.

The display device 200 provided in the embodiment of the present disclosure is a device in which a fingerprint module is integrated on the back of the display screen, and the fingerprint module may be arranged on the back of the display screen to realize a mobile terminal with under-screen fingerprint recognition and full-screen display. The display panel 210 in the embodiments of the present disclosure may be, for example, an Organic Electroluminance Display (OLED) panel, a Liquid Crystal Display (LCD) panel, a micro Light Emitting Diode (abbreviated as: micro LED) panel or other type of display panel. Generally, in order to realize various functions of the display device 200, its functional components, including for example various functional FPC 230, can be attached to the back of the display panel 210, that is, the side of the display panel 210 away from the light emitting surface. The connectors 231 of these functional FPCs can be coupled to the main board of the display device 200 to achieve corresponding functions.

It should be noted that, in the embodiment of the present disclosure, the glue film 211 for attaching the functional FPC 230 and the display panel 210 is generally provided as a double-sided glue film, that is, the two sides of the glue film 211 that are attached to the back of the display panel 210 and the functional FPC 230 respectively are glue surfaces to achieve the attaching effect of the display panel 210 and the functional FPC 230. In practical applications, other functional materials may also be provided between the two glue surfaces of the glue film 211, such as materials with excellent heat conduction function, so that the display device has better heat dissipation effect, that is, the glue film 211 can be used as a heat dissipation film for the display device; for another example, a material such as copper wires may be further provided between the two glue surfaces of the glue film 211, so that the glue film 211 has an electromagnetic shielding effect on a device attached thereby.

The fingerprint module 220 in the embodiment of the present disclosure includes only a sensor (FPS) and other necessary components for implementing a fingerprint recognition function. The fingerprint module 220 is directly integrated on the functional FPC 230 of the display device 200 and is attached to a side of the display panel 210 away from the light emitting surface through the bonding process of the functional FPC 230, thereby realizing the attachment of the fingerprint module 220 and the display panel 210. The display device 200 shown in FIG. 3 schematically illustrates a glass cover 212 disposed on a light outlet side of the display panel 210.

In the practical application of the embodiments of the present disclosure, the functional FPC 230 for integrating the fingerprint module 220 is not a dedicated FPC carrier as additionally provided in the related technology, but a component for achieving a specific function in the display device 200, that is, a functional FPC 230. In the embodiments of the present disclosure, the functional FPC 230 for carrying the fingerprint module 220 may be one of the following: a Main FPC (MFPC) for driving display, and a Touch FPC (TFPC) for driving touch, a FPC for driving display and touch (referred to as M-T FPC). The fingerprint module 220 is integrated on one of the above-mentioned several functional FPCs, and the signals of the fingerprint module 220 can communicate with the main board of the display device via the connector 231 of the functional FPC 230, thereby realizing the fingerprint recognition function of the fingerprint module 220.

It needs to be said that current display devices usually need to implement display functions and touch functions. The functional FPC 230 can generally include both MFPC and TFPC, or M-T FPC. M-T FPC integrates the functions of MFPC and TFPC on one FPC.

Comparing the structure of the fingerprint module 120 in the related technology with the structure of the fingerprint module 220 in the embodiment of the present disclosure, it can be seen that the embodiment of the present disclosure integrating a fingerprint module on the back of the display panel 210 (i.e., the side of the display panel 210 away from the light emitting surface) is different from the related technology in that: components such as sensors (FPS) and chips that implement the fingerprint module are directly integrated into the functional FPC of the display device 200, such as the MFPC, TFPC, or M-T FPC described above, so that no additional dedicated FPC carrier, connector and other devices are required, which saves dedicated FPC, connector, and package components for the fingerprint module, and saves the process steps required to make a separate fingerprint module; based on the integration and attaching method of the fingerprint module 220 in the embodiment of the present disclosure, it does not need to provide an additional dedicated machine for attaching the fingerprint module, and saves the identification, grasping, attaching, seal and curing, and attaching of a light shielding tape and other process steps required for the special attaching of the fingerprint module. Therefore, in the embodiment of the present disclosure, the manufacturing cost of the display device 200 is greatly reduced based on the integration method and the attaching method of the fingerprint module 220 in the display device 200.

The display device 200 provided by an embodiment of the present disclosure includes a display panel 210, a fingerprint module 220, and a functional FPC 230. A glue film 211 is attached to a side of the display panel 210 away from the light emitting surface. There is an opening area 211a disposed in the glue film 211. The functional FPC 230 is attached to the side of the display panel 210 away from the light emitting surface with a glue film 211. The fingerprint module 220 is disposed on the side of the functional FPC 230 close to the display panel 210, and the fingerprint module 220 is embedded in the opening area 211a of the glue film 211 with the functional FPC 230 to realize the integration and attaching of the fingerprint module 220 and the display panel 210. The display device 200 provided by the present disclosure can use the bonding process of the functional devices, i.e., the functional FPC 230, in the display device 200 to attach the fingerprint module 220 to the side of the display panel 210 away from the light emitting surface, without the need to make a fingerprint module separately. This not only saves the dedicated FPC carrier, connector and packaging components for the related fingerprint module, but also saves the dedicated machine and corresponding attaching process used when the related fingerprint module is attached, thereby reducing the manufacturing cost of the display device 200 to a great extent.

It should be noted that, in order to facilitate the attaching of the fingerprint module 120 in the related display device 100, the window of the opening area 110a of the glue film 111 for embedding the fingerprint module 120 is usually larger than the fingerprint module 120. There is a gap between the fingerprint module 120 and the glue film 111, which causes the display device 100 to generate a light leakage phenomenon.

Optionally, in order to avoid light leakage caused by the window of the glue film being larger than the fingerprint module, in the display device 200 of the embodiment of the present disclosure, the fingerprint module 220 may be located in a closed space formed by the opening area 211a of the glial film 211, the display panel 210 and the functional FPC 230. In this way, the functional FPC 230 can be used to block the gap between the fingerprint module and the glue film 211, thereby solving the light leakage phenomenon caused by the attaching method of the fingerprint module in the related display device, and improving the attaching yield of fingerprint module.

Optionally, in the embodiment of the present disclosure, as shown in FIG. 3, there may be a certain interval between the fingerprint module 220 and the display panel 110, which is not a directly attaching method with the frame glue as in the related technology.

Comparing the partial structure of the fingerprint module 120 in the related technology shown in FIG. 2 and the partial structure of the fingerprint module 220 in the embodiment of the present disclosure shown in FIG. 3, it can be seen that when the fingerprint module 120 in the related display device 100 is attached to the display panel 110, the fingerprint module 120 and the display panel 110 need to be attached with the frame glue 124. That is, the display panel 110 of the related technology needs to be attached with the fingerprint module 120 and then with other functional FPCs, which is a twice attaching process. The attaching of the fingerprint module 120 needs it to be directly attached to the display panel with the frame glue. The above attaching method will cause bad damage to the screen body of the display panel 110, which will cause a poor appearance of the screen. In the embodiment of the present disclosure, by the bonding process of the functional FPC 230, the fingerprint module 220 is attached to the side of the display panel 210 away from the light emitting surface. The fingerprint module 220 and the display panel 110 may be indirectly attached. That is, there may be a certain interval between the fingerprint module 220 and the display panel 110, and the display device 200 in the embodiment of the present disclosure only needs to perform a attaching process once, thereby avoiding multiple attaching processes and avoiding the bad loss to the screen appearance caused by attaching the fingerprint module 120 with the frame glue 124.

Further, for the related display device 100, when the fingerprint module 120 is attached, in order to facilitate accurate alignment, the fingerprint module 120 will be smaller than the window in the glue film 111, which will cause light leakage of the display device 100. In the related technology, a light shielding tape 120a is provided on the fingerprint module 120 (specifically, the dedicated FPC 122) and the glue film 111 to reduce the amount of light leakage. In addition, since the fingerprint module 120 will be smaller than the window in the glue film 111, there is a height difference between a side of the fingerprint module 120 and the glue film 111 after attaching, so that an indentation will occur on the packaged display device 100, which causes an adverse effect to the appearance of the display device.

In the display panel 200 of the embodiment of the present disclosure, since the functional FPC 230 can completely cover the gap between the fingerprint module 220 and the glue film 211, that is, the functional FPC 230 completely covers the opening area 211a of the glue film 211, thus avoiding problems related to indentation and poor appearance due to the attaching of fingerprint modules in the related technology.

It has been explained in the above embodiments that the fingerprint module 220 in the embodiment of the present disclosure is attached to the side of the display device 200 away from the light emitting surface by a bonding process of the functional FPC 230. The attaching of the fingerprint module 220 needs no additional dedicated FPC, and is realized by the functional device (i.e., the functional FPC 230) of the display device 200. Therefore, no additional connector is required. The fingerprint module 220 can be coupled to the main board of the display device 200 via the connector 231 of the functional FPC 230. Therefore, the fingerprint signal of the fingerprint module 220 can communicate with the main board via the connector 231 of the functional FPC 230.

In at least one implementation of the embodiment of the present disclosure, the functional FPC 230 in the display device 200 includes MFPC 230a and TFPC 230b. For the display device 200 of this structure, the fingerprint module 220 may be disposed on a side of the display panel 210 away from the light emission surface with the MFPC 230a or TFPC 230b.

Figure 4:
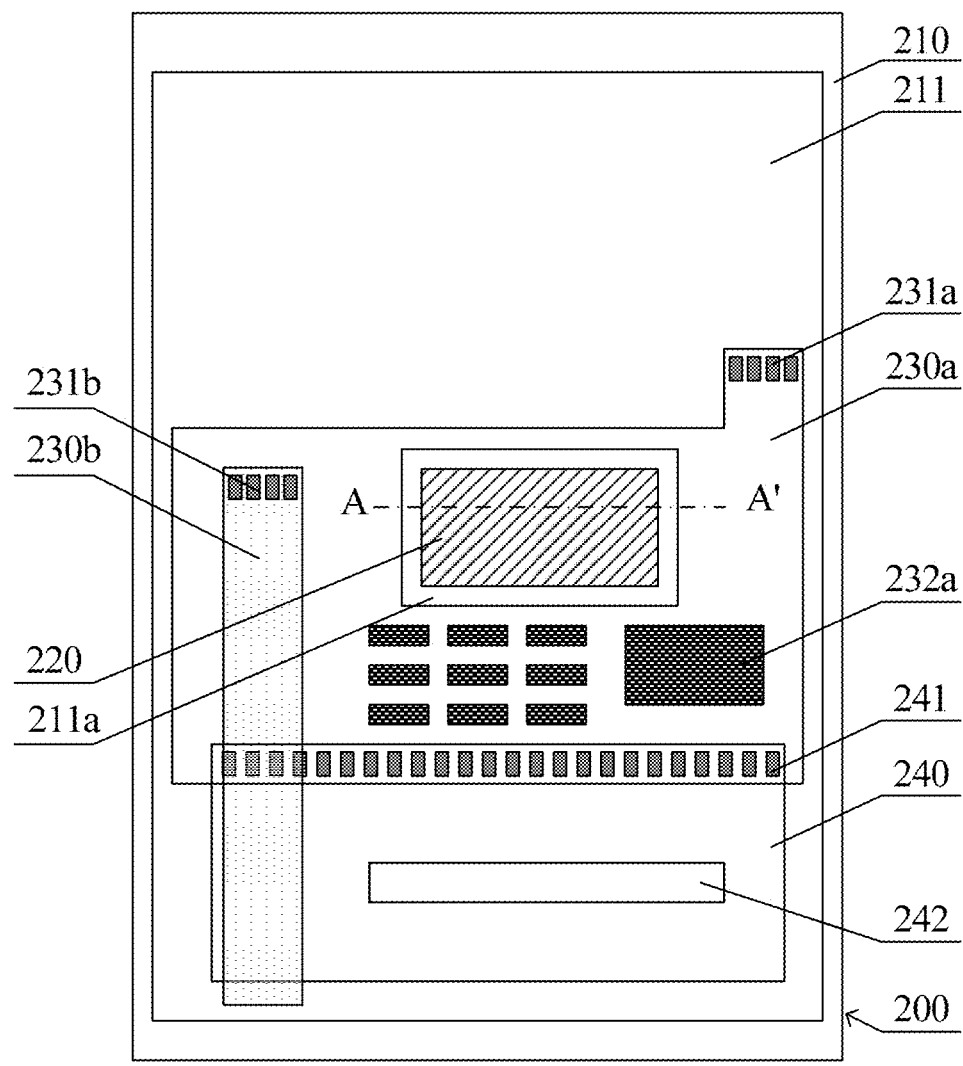
FIG. 4 is a schematic diagram of an overall structure of a display device according to an embodiment of the present disclosure.

As shown in FIG. 4, it is a schematic diagram of the overall structure of a display device according to an embodiment of the present disclosure. FIG. 4 is a top view of the display device 200, and FIG. 3 may be a cross-sectional view taken along the line A-A' in FIG. 4. In the display device 200 shown in FIG. 4, the fingerprint module 220 is integrated on the MFPC 230a, and the connector 231a of the MFPC 230a is coupled with the main board of the display device 200, the fingerprint signals of the fingerprint module 220 can communicate with the main board via the connector 231a of the MFPC 230a.

Figure 5:
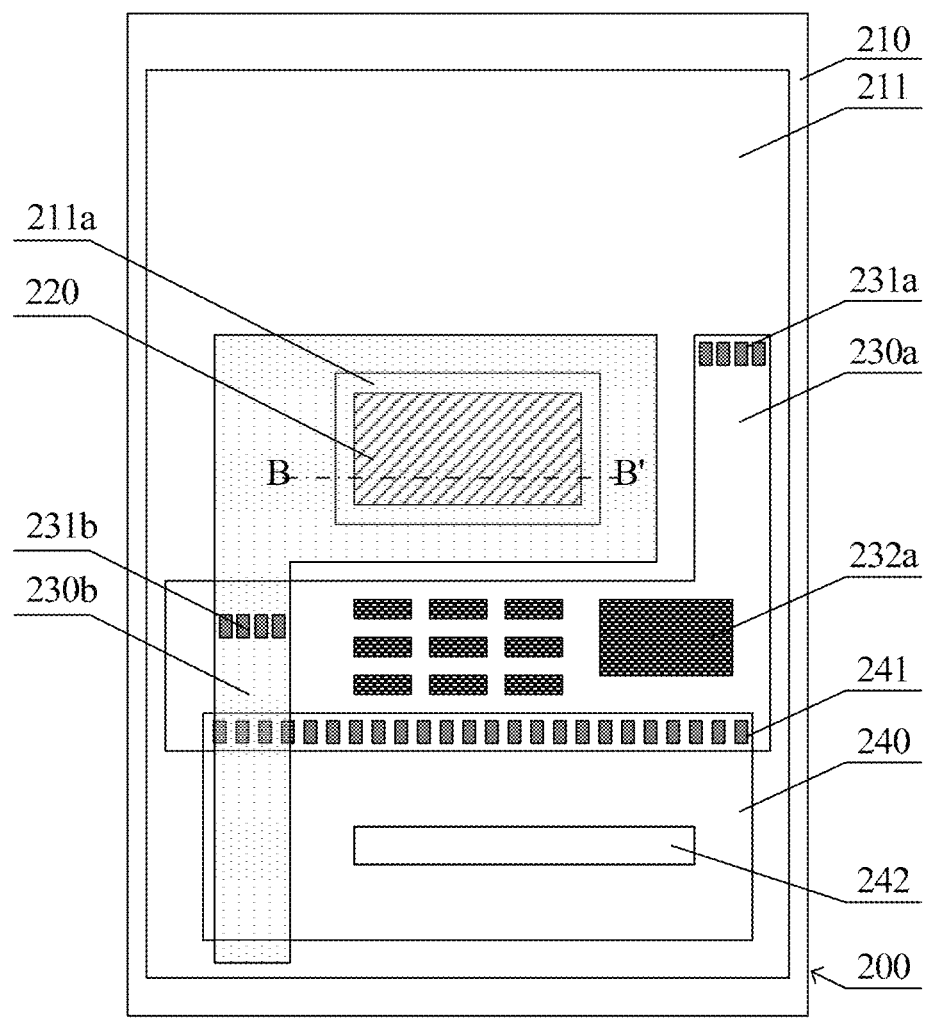
FIG. 5 is a schematic diagram of an overall structure of another display device according to an embodiment of the present disclosure.

As shown in FIG. 5, it is a schematic diagram of the overall structure of another display device provided by an embodiment of the present disclosure. FIG. 5 is a top view of the same display device 200. FIG. 3 may be a cross-sectional view taken along the line B-B' in FIG. 5. In the display device 200 shown in FIG. 5, the fingerprint module 220 is integrated on the TFPC 230b, and the connector 231b of the TFPC 230b is coupled to the main board of the display device 200, and the fingerprint signals of the fingerprint module 220 can communicate with the main board via the connector 231b of the TFPC 230b.

In at least one implementation of the embodiment of the present disclosure, the functional FPC 230 in the display device 200 is M-T FPC 230c, that is, the MFPC and TFPC in the above embodiment are integrated on one FPC, that is, M-T FPC 230c. For the display device 200 with such a structure, the fingerprint module 220 may be disposed on a side of the display panel 210 away from the light emitting surface with the M-T FPC 230c.

Figure 6:
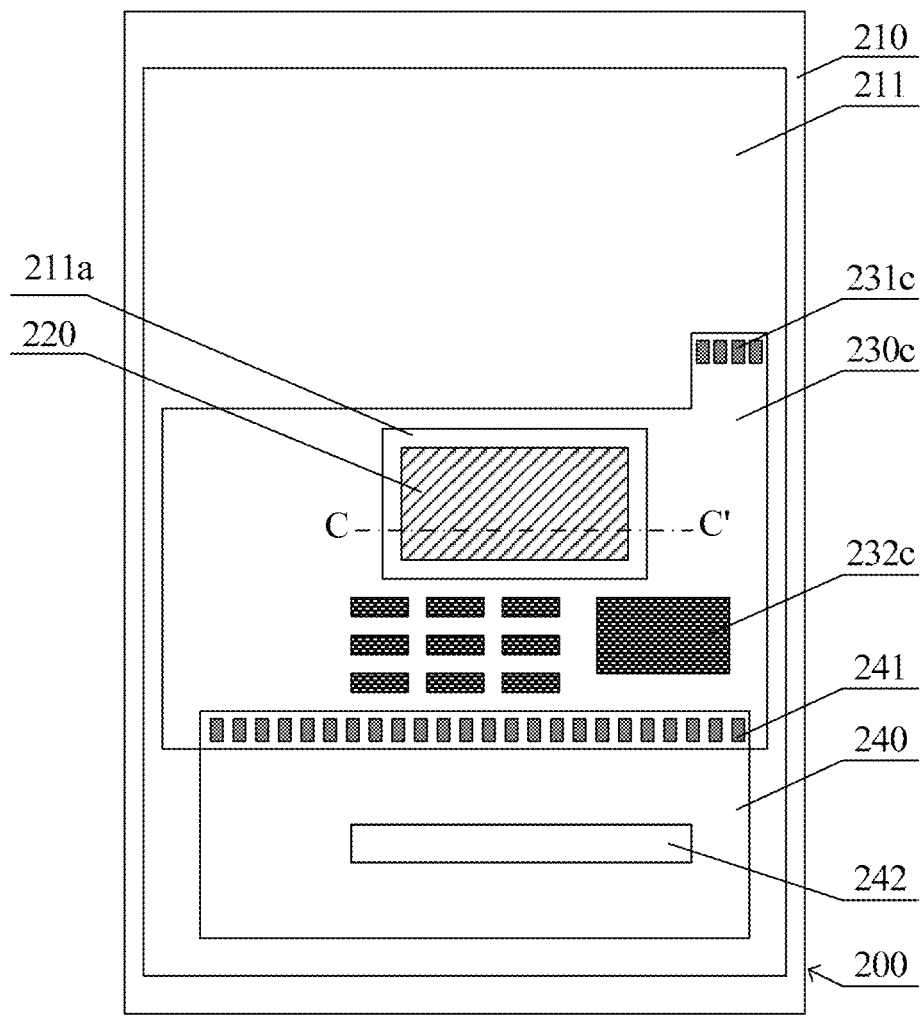
FIG. 6 is a schematic diagram of the overall structure of another display device according to an embodiment of the present disclosure.

As shown in FIG. 6, it is a schematic diagram of the overall structure of yet another display device according to an embodiment of the present disclosure. FIG. 6 is a top view of the same display device 200, and FIG. 3 may be a cross-sectional view taken along line C-C' in FIG. 5. In the display device 200 shown in FIG. 6, the fingerprint module 220 is integrated on the M-T FPC 230c. The connector 231c of the M-T FPC 230c is coupled to the main board of the display device 200, and the fingerprint signals of the fingerprint module 220 can communicate with the main board via the connector 231c of the M-T FPC 230c.

It should be noted that, in the structure shown in FIG. 5, the connector 231b of the TFPC 230b is directly coupled to the main board, or the connector 231b of the TFPC 230b is connected to the MFPC 230a, so as to be coupled to the main board via the connector 231a of the MFPC 230a. In addition, the display device 200 shown in FIG. 4 to FIG. 6 also illustrates a Chip On FPC (COF) 240 of the display panel 200, and the COF 240 is connected to the MFPC 230a (or M-T FPC 230c) via its connector 241. That is, the COF 240 is coupled to the main board of the display device 200 through MFPC 230a (or M-T FPC 230c), the COF 240 is also connected to the display panel 210, and a driving integrated circuit (Integrated Circuit, IC for short) 242 provided in the COF 240 can drive the display panel 210 to display. FIG. 4 to FIG. 6 show the components 232a (or components 232c) provided in the MFPC 230a (or M-T FPC 230c). The components are, for example, flash memory and other devices. In addition, the TFPC 230b may have an IC, which are not shown in FIG. 4 and FIG. 5.

Based on the display device 200 provided by the foregoing embodiments of the present disclosure, an embodiment of the present disclosure further provides a method for attaching a fingerprint module, and the method for attaching a fingerprint module is used to make the display device 200 provided by any of the foregoing embodiments of the present disclosure.

Figure 7:
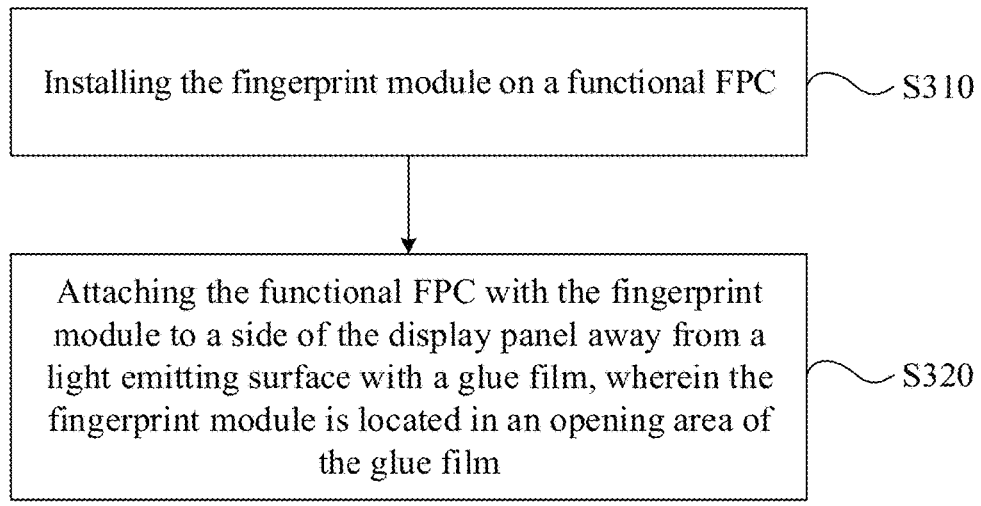
FIG. 7 is a flowchart of a method for attaching a fingerprint module according to an embodiment of the present disclosure.

As shown in FIG. 7, it is a flowchart of a method for attaching a fingerprint module according to an embodiment of the present disclosure. The method provided by the embodiment of the present disclosure may include the following steps:

S310, installing the fingerprint module on a functional FPC;

In S320, attaching the functional FPC with the fingerprint module to a side of the display panel away from a light emitting surface with a glue film, wherein the fingerprint module is located in an opening area of the glue film.

In the embodiments of the present disclosure, with reference to the display device 200 provided in the embodiment shown in FIG. 3 to FIG. 6, the attaching method provided in the embodiments of the present disclosure is the implementation for attaching the fingerprint module to the back of the display panel in the above embodiments. Based on the integration method and the attaching method of the fingerprint module in the display device shown in FIG. 3 to FIG. 6 described above, in the method for attaching the fingerprint module provided by the embodiment of the present disclosure, the fingerprint module includes a sensor (FPS) and other necessary components for realizing fingerprint recognition function. That is, there is no need to make a separate fingerprint module as in the related technology. The fingerprint module in the related technology includes dedicated FPC carriers, FPS, connectors and packaging components (including the frame glue and the light shielding tape, etc.).

The attaching method provided by the embodiment of the present disclosure does not require the process steps and dedicated process machines required to separately manufacture the fingerprint module, and only needs to install the sensor (FPS) and other necessary components to realize the fingerprint identification function (i.e., the fingerprint module in the embodiment of the present disclosure) on the existing functional FPC of the display device, so as to integrate the fingerprint module directly onto the functional FPC of the display device. Then, the functional FPC is attached to a side of the display panel away from the light emitting surface, so that the fingerprint module installed in the functional FPC is positioned between the functional FPC and the display panel during attaching.

Based on the structural relationship between the fingerprint module, the functional FPC, and the display panel in the embodiment of the present disclosure, and because the functional FPC and the display panel are usually attached with a glue film, as shown in FIG. 3, which shows the structural relationship among the fingerprint module, the functional FPC, the glue film and the display panel in the display device. Therefore, in order to integrate the fingerprint module on the side of the display panel away from the light emitting surface, an opening area for embedding the fingerprint module can be provided in the glue film before attaching so that when the functional FPC and the display panel are attached, the fingerprint module will be embedded in the opening area.

In practical applications of the embodiments of the present disclosure, the functional FPC used to integrate the fingerprint module is not a dedicated FPC carrier provided additionally in the related technology, but a component for implementing a specific function in a display device. The functional FPC carrying the fingerprint module in the embodiments of the present disclosure can be one of the following: FPC for driving display (i.e., MFPC), FPC for driving touch (i.e., Touch FPC, referred to as TFPC), and FPC for driving display and touch (referred to as M-T FPC). A fingerprint module is integrated on one of the above-mentioned several functional FPCs, and the signals of the fingerprint module can communicate with the main board of the display device via the connector of the functional FPC, thereby realizing the fingerprint identification function of the fingerprint module.

It needs to be said that the current display devices usually need to implement display functions and touch functions. The functional FPC may usually include both MFPC and TFPC, or include M-T FPC. M-T FPC integrates the functions of MFPC and TFPC on one FPC. In addition, when attaching a functional FPC, the MFPC, the TFPC, and the COF are generally attached as a whole. In the embodiment of the present disclosure, after the above-mentioned fingerprint module attaching process is performed, a main board can be configured, and the entire module (including the display panel, the fingerprint module, the MFPC, the TFPC, and the COF) is connected to the main board, and the rear cover of the terminal device is used as the packaging cover on the back.

Comparing the structure of the fingerprint module in the related technology with the display device manufactured by using the method for attaching the fingerprint module provided in the embodiment of the present disclosure, it can be seen that the difference between the embodiment of the present disclosure integrating the fingerprint module on the side of the display panel away from the light emitting surface and the related technology is in that: components such as the sensors (FPS) and chips that implement the fingerprint module are directly integrated into the functional FPC of the display device, such as the aforementioned MFPC, TFPC, or M-T FPC, so there is no need to provide additional dedicated FPC carriers, connectors, or other devices, which saves dedicated FPCs, connectors, and package components for the fingerprint module, and saves the process steps required to make a separate fingerprint module; based on the integration and attaching method for the fingerprint module in the embodiment of the present disclosure, it does not need to provide an additional dedicated machine for attaching the fingerprint module, and saves the special process steps required for attaching of the fingerprint module, such as the identification, grasping, attaching, sealing and curing, applying of light shielding tape, etc. Therefore, the fingerprint module attaching method provided in the embodiment of the present disclosure is used to bond and integrate the fingerprint module to the back of the display panel, which greatly reduces the manufacturing cost of fingerprint module integration and attaching.

The method for attaching the fingerprint module provided in the embodiment of the present disclosure includes mounting the fingerprint module on a functional FPC, and attaching the functional FPC with the fingerprint module to a side of a display panel away from the light emitting surface with a glue film, the fingerprint module being located in an opening area of the glue film, so as to realize the integration and attaching of the fingerprint module and the display panel. The method for attaching a fingerprint module provided by the present disclosure uses a functional device, i.e., a functional FPC, in a display device, as a carrier of the fingerprint module to bond the fingerprint module to the side of the display panel away from the light emitting surface. There is no need to make a separate fingerprint module, which not only saves dedicated FPC carriers, connectors and packaging components such as related fingerprint modules, but also saves the process steps required to make the separate fingerprint module, and saves the dedicated machine and the corresponding attaching process used when the related fingerprint module is attached. This greatly reduces the production cost of integration and attaching of the fingerprint module.

Figure 8:
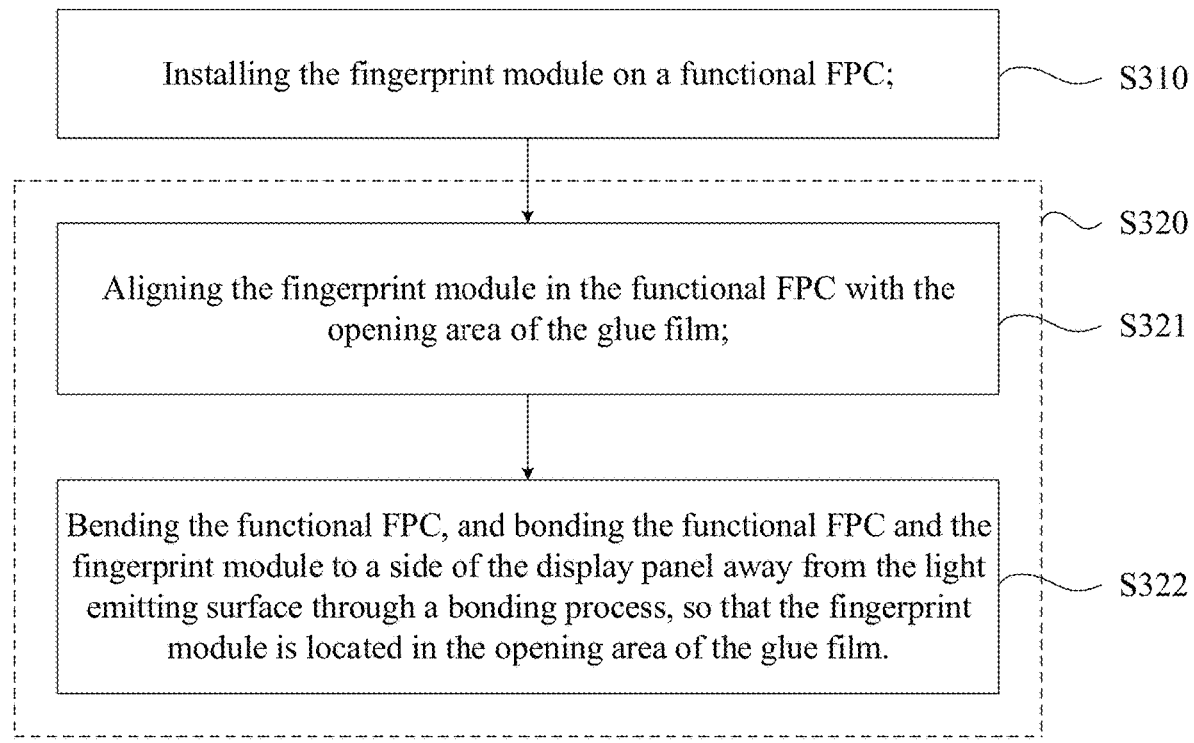
FIG. 8 is a flowchart of another method for attaching a fingerprint module according to an embodiment of the present disclosure.

Optionally, FIG. 8 is a flowchart of another method for attaching a fingerprint module according to an embodiment of the present disclosure. Based on the embodiment shown in FIG. 7, in the method provided in the embodiment of the present disclosure, S320 may include the following steps:

S321, aligning the fingerprint module in the functional FPC with the opening area of the glue film;

S322, bending the functional FPC, and bonding the functional FPC and the fingerprint module to a side of the display panel away from the light emitting surface through a bonding process, so that the fingerprint module is located in the opening area of the gelatinous film.

In the embodiment of the present disclosure, it is required that, after the functional FPC and the display panel are attached, the fingerprint module may be located in the opening area of the attaching component (i.e., the glue film). Hence, before attaching, the two parts that need to be matched are aligned, that is, the fingerprint module and the opening area of the glue film are aligned, so that the fingerprint module can be accurately embedded in the opening area of the glue film during attaching. In addition, in order to avoid light leakage caused by the window of the glue film being larger than the fingerprint module in the related technology, after the attaching method of the fingerprint module provided in the embodiment of the present disclosure is used for attaching, the fingerprint module may be located in a closed space formed by the opening area of the glue film, the display panel, and the functional FPC. In this way, the functional FPC can be used to block the gap between the fingerprint module and the glue film, thereby solving the light leakage phenomenon caused by the method of attaching the fingerprint module in the related display device, and improving the attaching yield of the fingerprint module.

In practical applications, when the functional FPC and the display panel are attached, the glue film can be attached to the display panel in advance, or it can be attached to the functional FPC in advance. A roll gum film can also be used while bending and bonding. The functional FPC installed with the fingerprint module can be folded and attached to achieve the attaching process, and the bonding process is completed. The fingerprint module is attached to the side of the display panel away from the light emitting surface along with the functional FPC, i.e., being attached to the back of the display screen of the mobile terminal. As shown in FIG.

Figure 9:
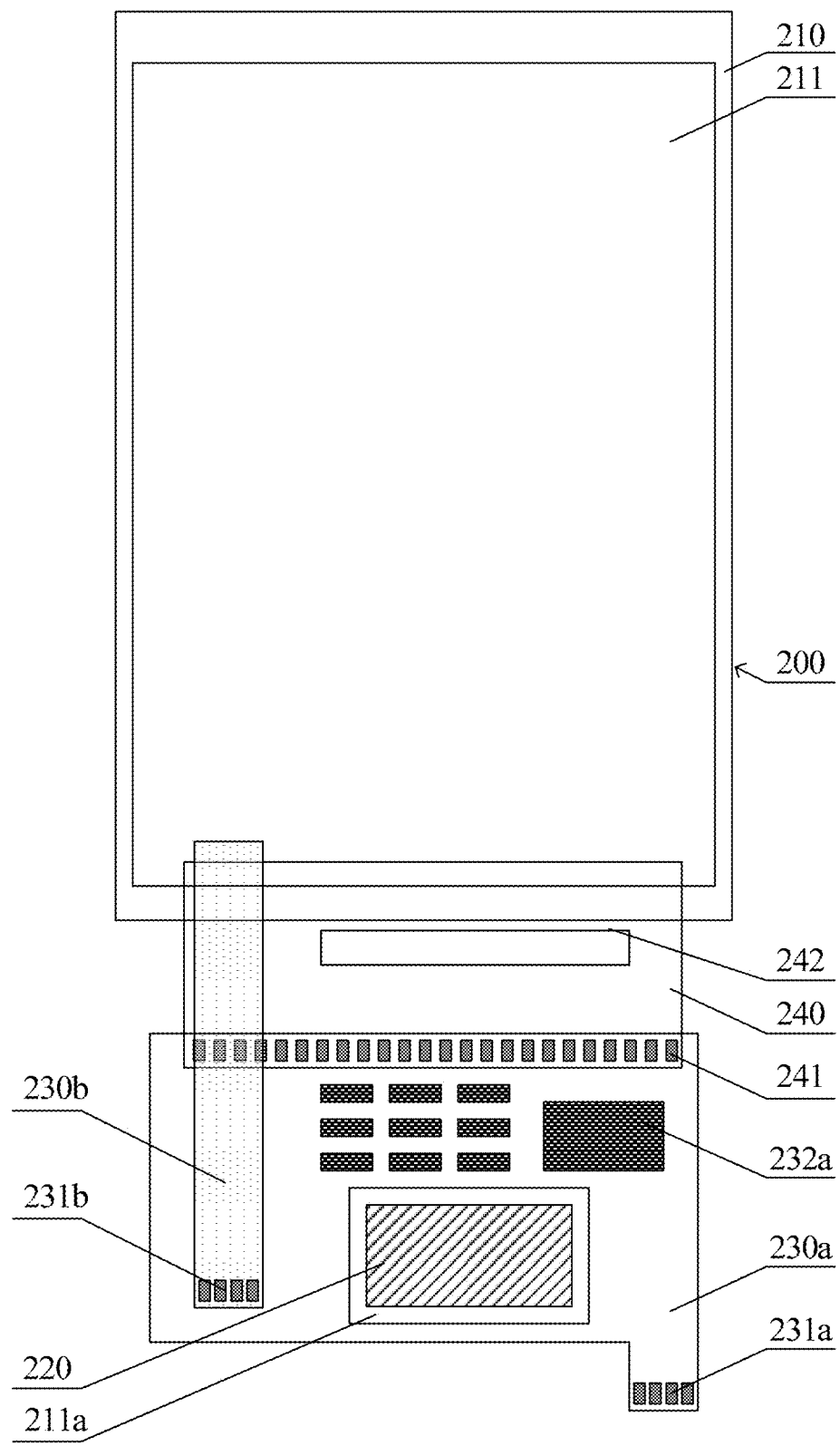
FIG. 9 is a schematic diagram of a bonding process in a method for bonding a fingerprint module according to an embodiment of the present disclosure.

9, it is a schematic diagram of a attaching process in a method for attaching a fingerprint module according to an embodiment of the present disclosure. FIG. 9 shows an example in which a fingerprint module is installed in a MFPC. Comparing FIG. 9 and FIG. 4, it can be seen that the components (such as the MFPC, TFPC, and COF) to be attached and before attaching are opposite to those after attaching, that is, the above-mentioned components to be attached need to be reversely configured before attaching, as shown by the effect in FIG. 9. During the bonding process, the above components are bonded from one side by a bending method, and after the bonding is completed, a positive effect appears, as shown in the structure shown in FIG. 4.

It should be noted that the structure of the display device manufactured by using the method for attaching the fingerprint module provided by the embodiment of the present disclosure is the same as the structure of the display device provided by the above embodiment of the present disclosure. The display device in any embodiment as shown in FIG. 3 to FIG. 6 can be referred. For example, there may be a certain distance between the fingerprint module and the display panel, and it is not a direct attaching method with the frame glue as in the related technology. This structure can not only avoid the multiple attaching processes and the bad loss to the screen appearance caused by attaching the fingerprint module with the frame glue as in the related technology, but can also avoid the problems of indentation and bad appearance caused by the attaching of the fingerprint module in the related technology.

It has been described in the above embodiments that the fingerprint module is integrated on one of the MFPC, the TFPC, and the M-T FPC, and the signals of the fingerprint module can communicate with the main board of the display device via the connector of the functional FPC, thereby realizing the fingerprint recognition function of the fingerprint module. Therefore, the method provided by the embodiment of the present disclosure may further include: coupling the connector of the functional FPC to the main board of the display device, so that the fingerprint module is coupled to the main board with the functional FPC.

Due to different hardware configurations of the display device, its functional FPC may include a MFPC and a TFPC, or only a M-T FPC.

In at least one implementation of the embodiments of the present disclosure, for display devices with different hardware configurations, the fingerprint module may be installed on the MFPC or on the M-T FPC. In this implementation, the implementation of the coupling of the connector of the functional FPC may include: coupling the connector of the MFPC or M-T FPC to the main board of the display device. At this time, the fingerprint module is coupled to the main board of the display device via the connector of the MFPC or the M-T FPC to implement the fingerprint identification function of the fingerprint module.

In at least one implementation of the embodiments of the present disclosure, the fingerprint module may be installed on a TFPC. In this implementation, the implementation of the coupling of the functional FPC connector can be implemented in the following two manners:

First, the connector of the TFPC is directly coupled to the main board of the display device. At this time, the fingerprint module is coupled to the main board of the display device via the connector of the TFPC to realize the fingerprint recognition function of the fingerprint module;

Second, the connector of the TFPC is coupled to the MFPC, and the connector of the MFPC is coupled to the main board of the display device. At this time, the TFPC and the fingerprint module are coupled to the main board via the connector of the MFPC to realize the fingerprint recognition function of the fingerprint module.

It should be noted that, in the embodiment of the present disclosure, when the functional FPC is bent and bonded, the above-mentioned process is usually performed together with the COF of the display device. The structure of the COF is shown in FIG. 4 to FIG. 6. The connector is connected to the MFPC or the M-T FPC via its connector, and is coupled to the main board of the display device through the MFPC or the M-T FPC, and the COF is also connected to the display panel.

Although the embodiments disclosed in the present disclosure are as described above, the content described is only embodiments adopted for facilitating understanding of the present disclosure, and is not intended to limit the present disclosure. Any person skilled in the art to which this disclosure belongs may make any modifications and changes in the form and details of implementation without departing from the spirit and scope disclosed in this disclosure, but the scope of patent protection of this disclosure must still be subject to the scope defined by the appended claims.

In order to make goals, technical solutions and advantages of the present disclosure more clear, embodiments of the present disclosure will be explained in detail in conjunction with drawings below. It is to be noted that, in a case where there is no conflict, embodiments in this application and features in embodiments may be combined with each other arbitrarily.

What is claimed is:

1. A display device comprising: a display panel; a fingerprint module; and a functional flexible circuit board (FPC);
a glue film is attached to a side of the display panel away from a light emitting surface, and an opening area is provided in the glue film, the functional FPC is attached to the side of the display panel away from the light emitting surface with the glue film, wherein the functional FPC comprises at least one of: a flexible circuit board MFPC for driving display; a flexible circuit board TFPC for driving touch; or a flexible circuit board M-T FPC for driving display and touch; and
the fingerprint module is disposed on a side of the functional FPC close to the display panel, and the fingerprint module is embedded in the opening area of the glue film.

2. The display device according to claim 1, wherein the fingerprint module is located in a closed space formed by the opening area of the glue film, the display panel and the functional FPC.

3. The display device according to claim 2, wherein there is a gap between the fingerprint module and the display panel.

4. The display device according to claim 1, wherein the fingerprint module is coupled to a main board of the display device via a connector of the functional FPC.

5. The display device according to claim 1, wherein the functional FPC includes the MFPC, the fingerprint module is disposed on a side of the MFPC close to the display panel, and is coupled to a main board of the display device via a connector of the MFPC.

6. The display device according to claim 5, further comprising the TFPC partially overlapping the MFPC, wherein the TFPC is coupled to the main board of the display device via a connector of the TFPC, and the connector of the TFPC is disposed on an area where the TFPC partially overlaps the MFPC.

7. The display device according to claim 1, wherein the functional FPC is the TFPC, the fingerprint module is disposed on a side of the TFPC close to the display panel and is coupled to a main board of the display device via a connector of the TFPC.

8. The display device according to claim 7, further comprising the MFPC that partially overlaps the TFPC, wherein the TFPC includes a first part and a second part, wherein the fingerprint module is disposed on the first part and the first part does not overlap with the MFPC, wherein a second part partially overlaps the MFPC and a connector coupled to the main board of the display device is provided on an area of the second part where the second part partially overlaps the MFPC.

9. The display device according to claim 1, wherein the functional FPC is the TFPC, the display device further comprises the MFPC that partially overlaps the TFPC, the fingerprint module is provided on a side of the TFPC close to the display panel and is connected to the MFPC via a connector of the TFPC, so as to be coupled to a main board of the display device via a connector of the MFPC.

10. The display device according to claim 9, wherein the TFPC comprises a first part and a second part, wherein the fingerprint module is provided on the first part and the first part does not overlap the MFPC, and the second part partially overlaps the MFPC and the connector of the TFPC is provided on an area where the second part partially overlaps the MFPC.

11. The display device according to claim 1, wherein the functional FPC includes the M-T FPC, the fingerprint module is disposed on a side of the M-T FPC close to the display panel and is coupled to a main board of the display device via a connector of the M-T FPC.

12. The display device according to claim 1, wherein the glue film comprises a heat dissipation layer and a glue layer laminated, wherein the heat dissipation layer is disposed on a side of the display panel away from the light emitting surface, one side of the glue film is attached to the heat dissipation layer, and the other side of the glue film is attached to the functional FPC.

13. The display device according to claim 1, wherein the glue film covers completely a side of the display panel away from the light emitting surface.

14. The display device according to claim 1, further comprising a Chip On FPC, wherein the Chip On FPC is connected with a flexible circuit board MFPC for driving display or a flexible circuit board M-T FPC for driving display and touch via a connector of the Chip On FPC, so as to be coupled with a main board of the display device through the MFPC or the M-T FPC.

15. The display device according to claim 14, wherein the Chip On FPC is connected to the MFPC or M-T FPC at a lower end of the MFPC or M-T FPC via a connector provided at an upper end of the Chip On FPC.

16. The display device according to claim 1, further comprising a glass cover provided on a side of the display panel close to the light emitting surface.

17. A method for attaching a fingerprint module, comprising:
   installing the fingerprint module on a functional flexible circuit board (FPC), wherein the functional FPC comprises at least one of: a flexible circuit board MFPC for driving display, a flexible circuit board TFPC for driving touch, or a flexible circuit board M-T FPC for driving display and touch; and
   attaching the functional FPC with the fingerprint module to a side of a display panel away from a light emitting surface with a glue film, so that the fingerprint module is located in an opening area of the glue film.

18. The method for attaching a fingerprint module according to claim 17, wherein attaching the functional FPC with the fingerprint module to the side of the display panel away from the light emitting surface with the glue film, comprising:
   aligning the fingerprint module in the functional FPC with the opening area of the glue film;
   bending the functional FPC, and attaching the functional FPC and the fingerprint module to the side of the display panel away from the light emitting surface through a bonding process, so that the fingerprint module is located in the opening area of the glue film.

* * * * *